United States Patent
St. Germain et al.

(10) Patent No.: US 7,935,575 B2
(45) Date of Patent: May 3, 2011

(54) METHOD OF FORMING A SEMICONDUCTOR PACKAGE AND STRUCTURE THEREFOR

(75) Inventors: Stephen St. Germain, Scottsdale, AZ (US); Roger M. Arbuthnot, Mesa, AZ (US); Frank Tim Jones, Gilbert, AZ (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 492 days.

(21) Appl. No.: 12/098,813

(22) Filed: Apr. 7, 2008

(65) Prior Publication Data
US 2009/0250794 A1   Oct. 8, 2009

(51) Int. Cl.
*H01L 21/00* (2006.01)
*H01L 21/58* (2006.01)

(52) U.S. Cl. ........ 438/123; 438/108; 257/670; 257/676; 257/E23.043; 257/E23.05; 257/E23.052

(58) Field of Classification Search .............. 438/123, 438/108; 257/E23.066, E23.043, E23.044, 257/E23.045, E23.05, E23.052, 666, 670, 257/672, 676, E33.066
See application file for complete search history.

(56) References Cited

U.S. PATENT DOCUMENTS

| | | | |
|---|---|---|---|
| 6,081,031 A | 6/2000 | Letterman, Jr. et al. | |
| 7,777,315 B2 * | 8/2010 | Noquil | 257/678 |
| 7,812,437 B2 * | 10/2010 | Noquil et al. | 257/690 |
| 2004/0262781 A1 | 12/2004 | Germain et al. | |
| 2006/0108671 A1 | 5/2006 | Kasem et al. | |

* cited by examiner

*Primary Examiner* — Julio J Maldonado
(74) *Attorney, Agent, or Firm* — Robert F. Hightower (57) ABSTRACT

In one embodiment, a semiconductor package is formed to include a leadframe that includes a plurality of die attach areas for attaching a semiconductor die to the leadframe. The leadframe is positioned to overlie another leadframe that forms some of the external terminals or leads of the package.

10 Claims, 5 Drawing Sheets

METHOD OF FORMING A SEMICONDUCTOR PACKAGE AND STRUCTURE THEREFOR

BACKGROUND OF THE INVENTION

The present invention relates, in general, to electronics, and more particularly, to methods of forming packaging structures for semiconductor devices.

In the past, the semiconductor industry utilized various methods and structures to form packages that encapsulated a semiconductor die and provided leads for electrically connecting to the semiconductor die. In one type of semiconductor package, the semiconductor die was mounted flip-chip style between two leadframes. The upper leadframe had a continuous flat surface on which the die was mounted and a foot that was mechanically attached to the lower leadframe. This configuration provided an inaccurate positioning of the semiconductor die to the lower leadframe. In addition, the various parts and assembly steps increased the cost of the encapsulated semiconductor device.

Accordingly, it is desirable to have a semiconductor package that accurately positions the semiconductor die and that provides a lower cost package.

For simplicity and clarity of the illustration, elements in the figures are not necessarily to scale, and the same reference numbers in different figures denote the same elements. Additionally, descriptions and details of well-known steps and elements are omitted for simplicity of the description. As used herein an electrode of a semiconductor die means an element of a device that is formed as a portion of an active element of the semiconductor die that carries current through the device such as a source or a drain or a gate of an MOS transistor or an emitter or a collector or a base of a bipolar transistor or a cathode or anode of a diode. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten per cent (10%) are reasonable variances from the ideal goal of exactly as described.

DETAILED DESCRIPTION OF THE DRAWINGS

Figure 1:
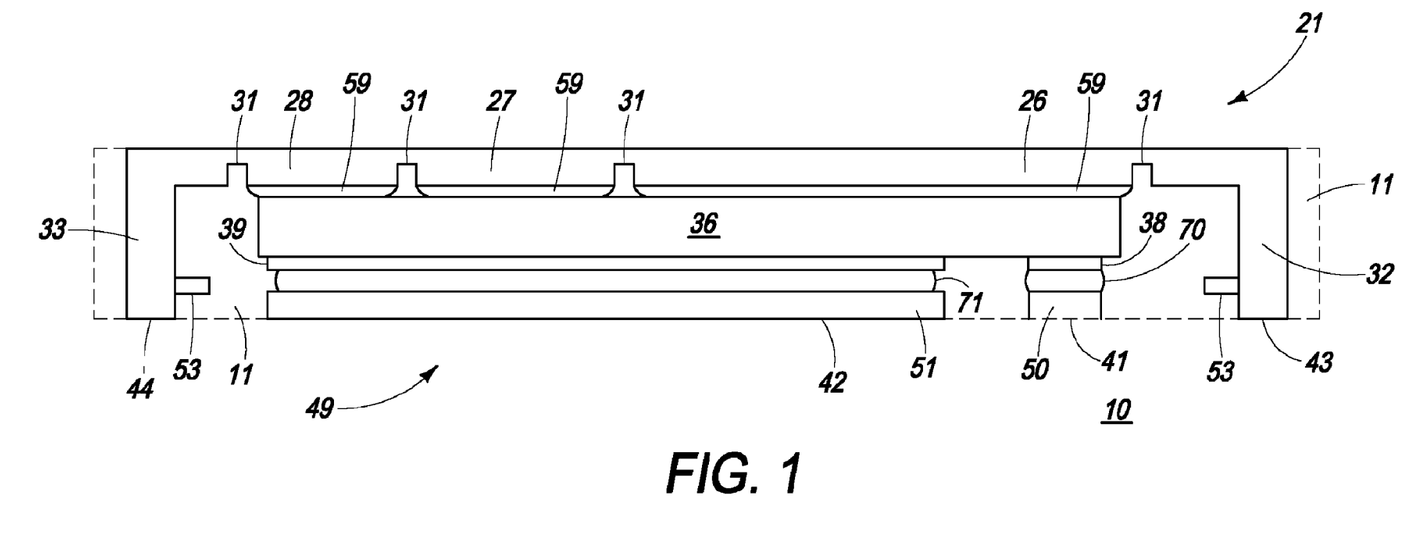
FIG. 1 illustrates an enlarged cross-sectional view of an embodiment of a semiconductor package that includes an upper leadframe and a lower leadframe.

FIG. 1 illustrates an enlarged cross-sectional view of an embodiment of a semiconductor package 10. Package 10 includes a package body 11. An upper leadframe 21 of package 10 (illustrated in a general manner by an arrow) has a semiconductor die 36 attached thereto. In the preferred embodiment, semiconductor die 36 is a vertical metal oxide semiconductor field effect (MOS) transistor in which a bottom surface of the semiconductor substrate of die 36 has a drain electrode of the MOS transistor and a top surface of the MOS transistor has a gate electrode and one or more source electrodes. A lower leadframe 49 of package 10 includes a first contact pad 50 that is configured to form electrical connection to the gate electrode of die 36 and a plurality of second contact pads 51 that are configured to form electrical connection to the source electrodes of die 36.

Figure 2:
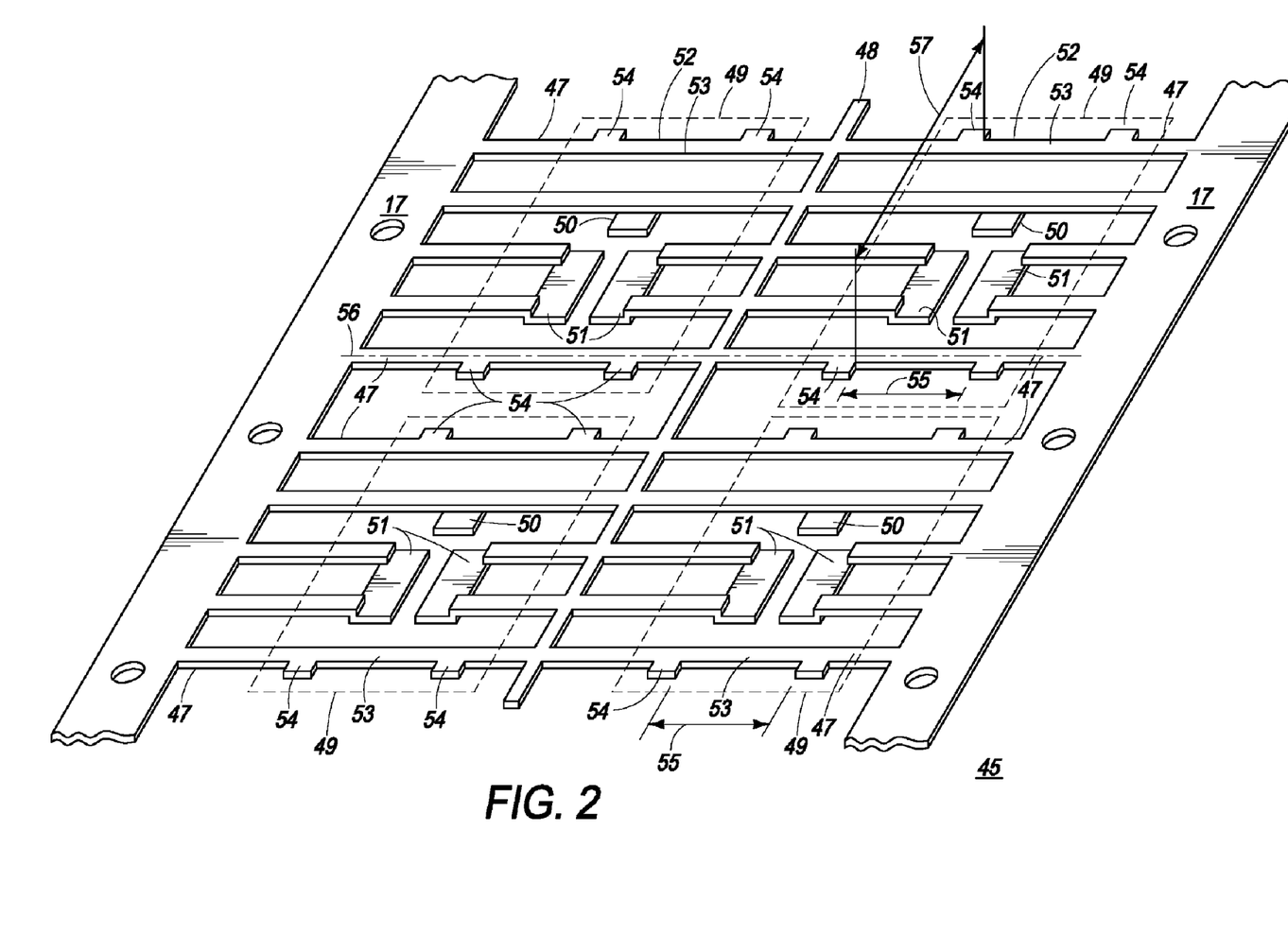
FIG. 2 illustrates an enlarged isometric view of a top side of a leadframe assembly that includes the lower leadframe of FIG. 1.

FIG. 2 illustrates an enlarged isometric view of a top side of a leadframe assembly 45 that is used to form lower leadframe 49 of package 10. As is well known to those skilled in the art, a leadframe assembly generally begins as a solid metal panel that has package sites where leadframes for the package site, such as leadframes 49 (illustrated by dashed lines), are to be formed. The material use for the leadframe may be any well know material that is used for a semiconductor package leadframe including copper, an alloy that includes copper, a metal that is plated with copper, iron/nickel alloys, a conductor, and an insulator (for example plastic) that is formed to be electrically conductive such as by plating a conductor onto the insulator. The material of assembly 45 is formed into various packaging sites which each include a leadframe 49, illustrated in general by dashed lines. Each packing site typically will be used to form lower leadframe 49 of a semiconductor package similar to package 10 that is illustrated in FIG. 1. Each leadframe 49 contains a plurality of leadframe elements that will be used for each leadframe 49. The individual leadframe elements are connected mechanically together by tie bars 47 that attach to the individual leadframe elements and to a side rail or side panel 17 of assembly 45. Each leadframe 49 includes first contact pad 50 that is configured to be electrically connected to the gate electrode of semiconductor die 36 (FIG. 1). Contact pad 50 generally is formed as a base or plate which has a flat surface that makes electrical and mechanical contact to the gate electrode of die 36. Contact pad 50 generally provides a low resistance electrical connection to the gate electrode of die 35. Pad 50 is attached to and held in place by a tie bar 47 that is mechanically attached to side panel 17 and to a central supporting tie bar 48. Tie bars 47 and 48 fix the position of contact pad 50 relative to contact pad 51. Each leadframe 49 also includes plurality of second contact pads 51 that are configured to be electrically connected to the source electrodes of die 36. Second contact pads 51 generally are formed as a base or plate which has a flat surface that makes electrical and mechanical contact to the source electrode of die 36. Each pad 51 is attached to and held in place by another tie bar 47 that is mechanically attached to side panel 17 and to central supporting tie bar 48. Tie bars 47 and 48 also fix the position of contact pads 51 relative to contact pad 50. The top surfaces of contact pads 50 and 51 usually are formed in a plane that is different than a plane of tie bars 47. In the preferred embodiment, the top surfaces of pads 50 and 51 are attached to and extend outward from a lower edge of the lower surface of tie bars 47 such that the plane of pads 50 and 51 abuts a plane of the lower surface of tie bars 47. In this configuration of the preferred embodiment, tie bars 47 form stops along an edge of pads 50 and 51 that assist in aligning the semiconductor die to pads 50 and 51 and also assist in minimizing rotation of the die during assembly operations. In other embodiments, tie bars 47 may be formed with a bend or other configuration. As will be seen further hereinafter, a bottom surface of pad 50 (a surface that is opposite to die 36)

forms a lead 41 of package 10 (see FIG. 1) and a bottom surface of pads 51 (a surface that is opposite to die 36) forms other leads 42 of package 10.

Each leadframe 49 also includes a plurality of positioning elements 53 that also are attached to panel 17 and to central tie bar 48 with tie bars 47. Tie bars 47 and 48 also fix the position of elements 53 relative to contact pads 50 and 51. An outer edge 52 (an edge that is outward from the interior of leadframe 49) of each positioning element 53 includes a plurality of positioning features 54. Positioning features 54 extend outwardly from positioning element 53 away from the interior of leadframe 49. Positioning features 54 may be formed as tabs that are space along outer edge 52 of positioning element 53 and are separated apart from each other by a distance 55. As will be seen further hereinafter, features 54 and the portion of outer edge 52 that is between features 54 form a receptacle that is used to accurately position upper leadframe 21 relative to lower leadframe 49. Outer edges 52 of elements 53 are separate by a distance 57. The portion of outer edge 52 that is between features 54 usually is configured to abut a portion of leadframe 21. Positioning elements 53 and features 54 are formed to be in a plane that closer to die 36 (FIG. 1) than the plane of the bottom surface of pads 50 and 51 so that the lower surface of positioning elements 53 and features 54 are not exposed external to body 11 after package 10 is encapsulated (FIG. 1).

Tie bars such as tie bars 47 and 48, and side panels such as panels 17 are well known to those skilled in the art. As is well known in the art, tie bars 47 and 48 in addition to side panels 17 hold the individual elements of each leadframe 49 in place during the assembly of package 10. Other well know means for holding pads 50 and 51 in positional alignment with element 53 and features 54 during the assembly process may also be used.

Figure 3:
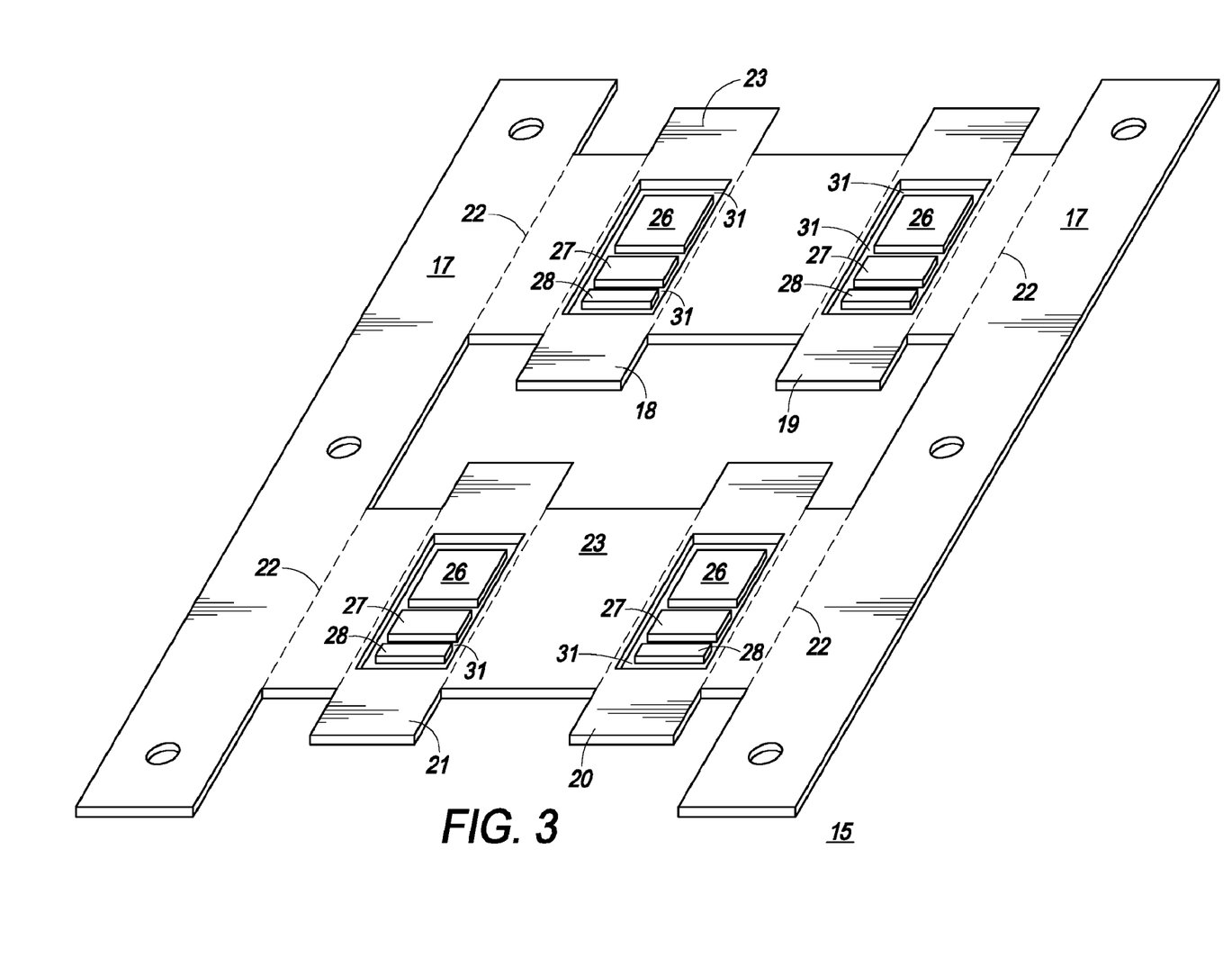
FIG. 3 illustrates an enlarged isometric view of a bottom view of another leadframe assembly that includes the upper leadframe of FIG. 1.

FIG. 3 illustrates an enlarged isometric view of a bottom of an embodiment of another leadframe assembly 15 that is utilized for forming leadframe 21 that was explained in the description of FIG. 1. As is well known to those skilled in the art, a leadframe assembly generally begins as a solid metal panel that has sites where leadframes such as leadframes 18, 19, 20, and 21 (illustrated by dashed lines) are to be formed. Assembly 15 generally has a flat surface 23 on which the leadframes are formed. Dashed lines 22 illustrate where side panels 17 subsequently are to be formed. For each of leadframes 18-21, a plurality of die attach areas 26, 27, and 28 are formed. Die attach areas 26-28 will subsequently be utilized for attaching a semiconductor die, such as die 36, to one or more of areas 26-28. A recess 31 is formed to surround each of areas 26-28 so that the surface of each die attach area 26-28 is separated from each other die attach area of that leadframe and from surface 23. Recess 31 extends from surface 23 a first depth into the material of assembly 15. The first depth and the width of recess 31 are formed to ensure that any die attach material that is used for attaching a die to any of areas 26-28 will not bridge from the die attach area to surface 23 and will not bridge between any of areas 26-28. The width of recess 31 typically is formed to be about fifty to three hundred (50-300) and preferably about two hundred (200) microns wide and the depth is formed to be about fifty to three hundred thirty (50-330) and preferably about one hundred (100) microns deep.

A portion of the material used for assembly 15 is removed so that a support or tie bar 75 may be formed for each of leadframes 18-20. Tie bars 75 fix the position of leadframes 18-21 relative to each other and to side panel 17. Some of the material of assembly 15 is removed so that portions of each of leadframes 18-21 are separated from and extend from the remainder of the material of assembly 15.

Leadframes 49 and 18-21 may be formed by a variety of well-known leadframe manufacturing techniques including stamping, etching, coining, half-etching, and other well-known leadframe manufacturing techniques. For example, the panel of assembly 15 may be stamped to remove portions of the material to form the shape of leadframes 18-21 and during the same step or at a different step, assembly 15 may be coined to form die attach areas 26-28 and recess 31.

Figure 4:
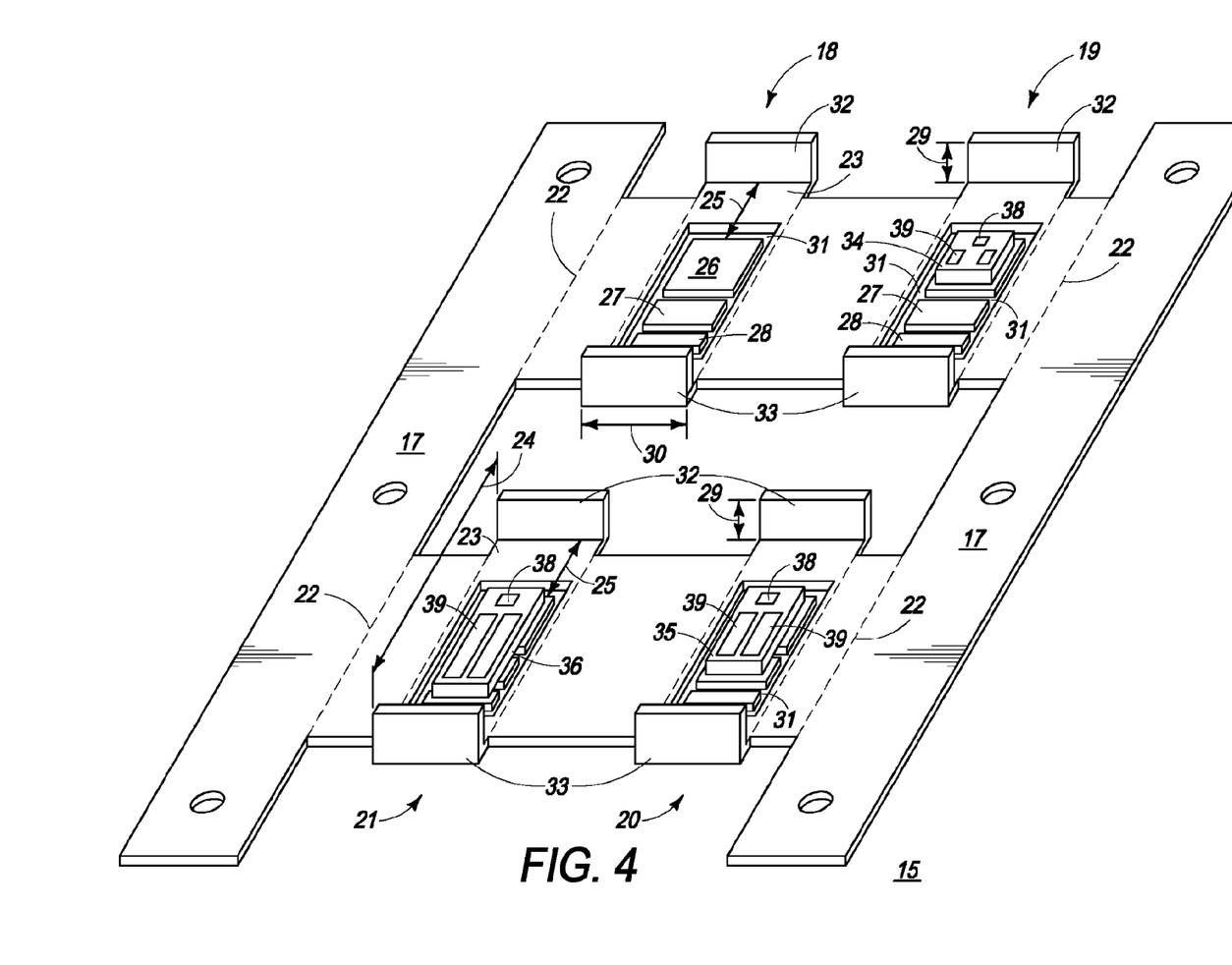
FIG. 4 illustrates an enlarged isometric view of the leadframe assembly of FIG. 3 at a subsequent stage in an embodiment of a method of forming the leadframe assembly.

FIG. 4 illustrates assembly 15 at another subsequent stage in an embodiment of a method of forming leadframes 18-21. A portion of the material for each of leadframes 18-20 is formed into a first support 32 and a second of support 33 that will subsequently be used for providing mechanical support for each of leadframes 18-20. Supports 32 and 33 may be formed by a variety of well know techniques including by bending the material of leadframes 18-21 that was separated from the remaining portion of assembly 15 as illustrated in FIG. 3. Supports 32 and 33 are formed to have a width 30 that is no greater than distance 55 of leadframes 49 (FIG. 2). Generally, width 30 is formed to be about twenty-five to one hundred thirty (25-130) microns less than distance 55 to ensure that supports 32 and 33 can be positioned between features 54 during an automated assembly process. The forming operation forms supports 32 and 33 that extend away from surface 23 at an angle that is less than one hundred and eighty degrees relative to surface 23 and preferably is approximately ninety degrees relative to surface 23. Each of supports 32 and 33 are formed with a length 29 from surface 23. Length 29 is chosen to ensure that the bottom surface of supports 32-33 (the surface that is distal from surface 23) will be exposed after package 10 is encapsulated. Length 29 generally is approximately no less than the thickness of die 36 plus the thickness of the die attachment material used for attaching die 36 to areas 26-29 plus the thickness of leadframe 49 plus the thickness of any conductive adhesive material that will be used to electrically connect pads 50 and 51 to electrodes 38 and 39.

Subsequently, a semiconductor die is generally attached to each of leadframes 18-21. The semiconductor die may be attached to areas 26-28 by a variety of well-known electrically conductive die attachment materials such as solder, conductive epoxy, conductive polyimide, a conductive glass material, or other well-known conductive attachment material. In some embodiments, the die attachment material may not be electrically conductive. The semiconductor die may be attached to one or more of areas 26-28 depending on the size of the semiconductor die. In order to ensure that the semiconductor die will subsequently be properly aligned to leadframe 49, die attach area 26 is always used for the die attachment procedure. If the size of the semiconductor die is large enough that the surface area of the semiconductor die is greater than the surface area of die attach area 26, the semiconductor die may also overlie area 27 or even areas 27 and 28. As can be seen from FIG. 1, each of leadframes 18-20 are subsequently inverted and positioned to overlie the top surface of leadframe 49. Die attach area 26 is positioned a distance 25 away from support 32 so that a semiconductor die that is attached to area 26 will have electrodes that are aligned with contacts pads 50 and 51 (FIG. 2). For example, a single semiconductor die 34 may be attached to area 26 as illustrated by leadframe 19. Die 34 has a gate electrode 38 and source electrodes 39 on a top surface of die 34. Distance 25 is selected to ensure that electrodes 38 and 39 will align with respective contact pads 50 and 51 when leadframe 19 is flipped over and positioned to overlie leadframe 49 (FIG. 1). In another example, a larger semiconductor die 35 that is larger than die 34 may be attached to one of leadframes 18-21 as illustrated by leadframe 20. Because die 35 is larger than die 34, die 35 needs a larger die attach area, thus, die 35 may be attached to both of areas 26 and 27 as illustrated by leadframe 20. Because die 35 is larger than die 34, the length of die 35 is increased to provide the increases size. Also, the length of source electrodes 39 is increased to provide a larger and lower resistance contact to die 35. The position of gate electrode 38 remains in the same position as on die 34. This assists in providing proper alignment between die 35 and leadframe 49. The position of die attach area 26 ensures that electrodes 38 and 39 align with respective contact pads 50 and 51 when leadframe 20 is inverted to overlie leadframe 49. In yet another embodiment, an even larger die 36 may be attached to one of or all of leadframes 18-20 (such as is illustrated by leadframe 21). Similar to die 35, the length of die 36 is increases to provide the increased size of die 36. The length of source electrodes 39 are also increased to provide a lower resistance contact. The larger size of die 36 causes die 36 to overlie and be attached to areas 26, 27, and 28 of leadframe 21. Because the positional relationship of die attach area 26 and electrode 38 are not changed, electrodes 38 and 39 of die 36 will also align with respective contact pads 50 and 51 of leadframe 49.

A die attachment material 59 (see FIG. 1) for attaching the semiconductor die to areas 26-28 is applied to the one or more of areas 26-28 that are going to be utilized for the semiconductor die. The volume of the attachment material applied to each die attach area is calculated and controlled to provide a specific joint thickness between the semiconductor die and the die attach area. Because the surfaces of die attach areas 26-28 are substantially smooth and planar, the die attachment material is equally attracted to all points of the die attach area causing the die attachment material to wet and spread evenly across the selected one or more of die attach areas 26-28. Recess 31 prevents bridging of die attachment material between die attach areas 26-28, thus, the height and volume of the attachment material on each die attach area can be precisely controlled. Consequently, the volume applied to each die attach area preferably is selected to provide the same height and ensure that the semiconductor die is co-planar to surface 23. The volume applied to each of areas 26-28 may be different if the surface area of each of areas 26-28 is different. When the semiconductor die is positioned on the die attachment material, the surface tension of the die attachment material and the wetting adhesion force between the die attachment material and the semiconductor die and between the die attachment material and areas 26-28 holds the semiconductor die in place. Because the die attachment material usually spreads to the outer edges of each individual area 26-28, the surface tension holds the die in place. Recess 31 prevents the die attachment material from spreading beyond the surface of each individual die attach area 26-28 thereby preventing theta rotation of the die and ensuring that each die is precisely positioned relative to die attach area 26 so that electrodes 38 and 39 of the die are aligned to respective contact pads 50 and 51 of leadframe 49.

Figure 5:
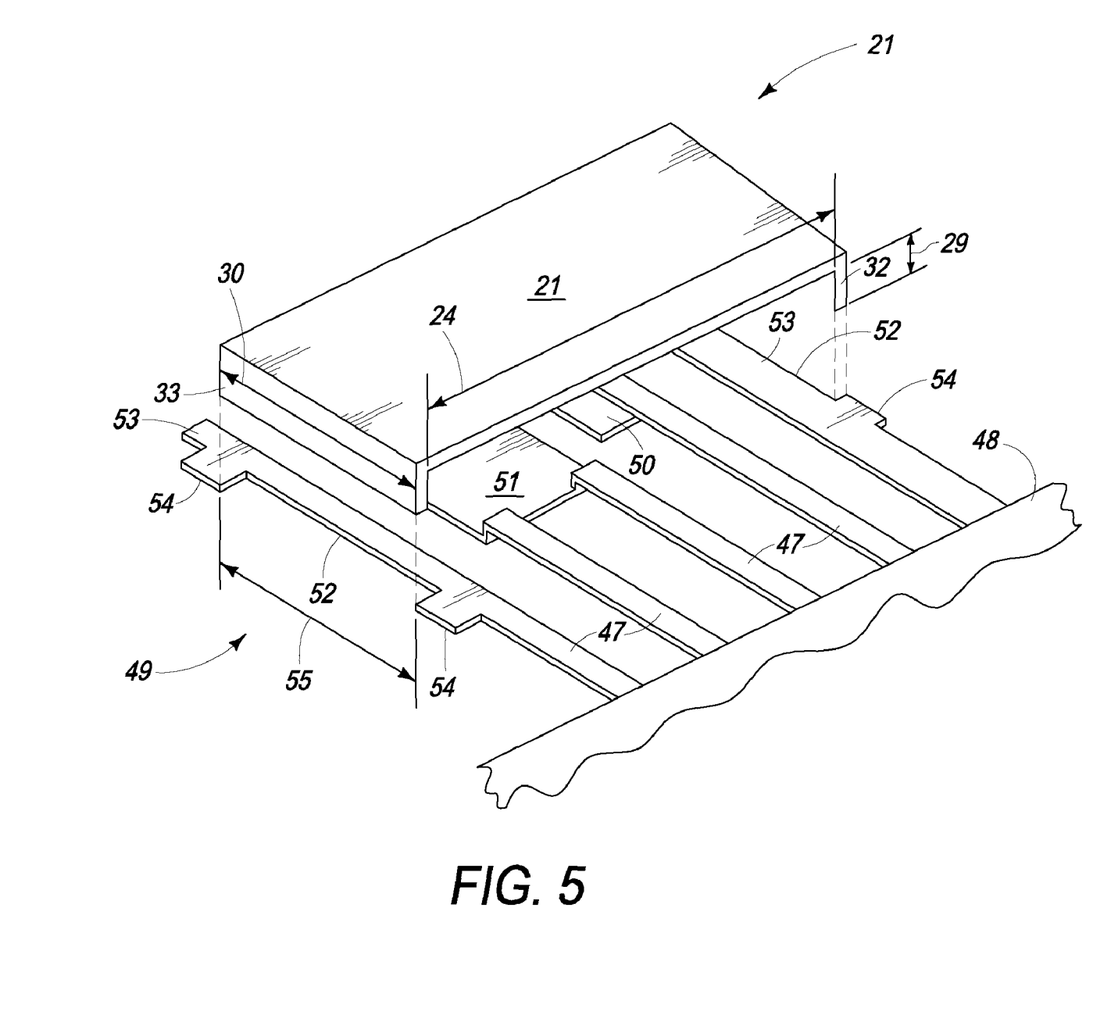
FIG. 5 illustrates an enlarged exploded isometric view of the upper and lower leadframes of FIG. 1 in an embodiment of a method of forming the package of FIG. 1.

FIG. 5 illustrates an exploded isometric view of leadframe 21 (FIG. 4) overlying one of leadframes 49 (FIG. 2). In one embodiment of a method of forming package 10 (FIG. 1), each of leadframes 18-20 are singulated from leadframe assembly 15 prior to mating leadframes 18-21 with leadframes 49. In such an assembly embodiment, leadframes 18-21 are singulated from assembly 15 using well-known singulation techniques. Leadframes 49 usually remain attached within leadframe assembly 45. For clarity of the drawings, only one leadframe 49 is shown in FIG. 5 although leadframes 49 generally remain attached to assembly 45. Also for clarity of the drawings and explanation, panels 17 are not shown and only a portion of tie bars 47 and 48 are illustrated.

An electrically conductive attachment material 70 and 71 (see FIG. 1) usually is applied to each of respective contact pads 50 and 51 of leadframe 49. Material 70 generally is an electrically conductive attachment material such as solder, conductive epoxy, conductive polyimide, a conductive glass material, or other well-known conductive attachment material. A pick-and-place machine typically would pick-up one of leadframes 18-20, invert the leadframe, and position the leadframe on one leadframe 49. Because width 30 of supports 32 and 33 is no greater than distance 55 of leadframe 49, and distance 24 between supports 32 and 33 is no greater than distance 57 of leadframe 49, positioning elements 53 (including features 54) control the spatial relationship between leadframe 21 and leadframe 49. An outer side of supports 32 and 33 may abut features 54 and an inner side of supports 32 and 33 generally abut edge 52 of element 53. Generally, width 30 is formed to be about twenty-five to one hundred thirty (25-130) microns less than distance 55 to ensure that supports 32 and 33 can be positioned between features 54 during an automated assembly process. Distance 24 of leadframe 21 usually is no less than distance 57 of leadframe 49 and preferably is about twenty-five to one hundred thirty (25-130) microns less than distance 57 to ensure that supports 32 and 33 can be positioned outside of element 53 during an automated assembly process. Consequently, when leadframe 21 is positioned on leadframe 49, electrodes 38 and 39 of the semiconductor die align with respective connection pads 50 and 51 of leadframe 49.

Attachment material 70 and 71 is cured be a means that is proper for the type of attachment material to form an electrical connection between pads 50 and 51 and respective electrodes 38 and 39 of the semiconductor die. For example, attachment materials 59, 70, and 71 may be solder. For such an embodiment, during the die attach step the solder of material 59 is reflowed to cure the material and attached the die to the die attach area of the leadframe. During the step of attaching the die to pads 50 and 51, the solder of material 70 and 71 is reflowed to cure the material and electrically attach the electrodes of the die to pads 50 and 51. During this reflow operation, die attachment material 59 is also heated and softened again. This reheating ensures that the alignment of the die to areas 26-28 is maintained in addition to the alignment between areas 26-28 and pads 50 and 51. In another example embodiment, attachment materials 59, 70, and 71 may be conductive epoxy. For such an embodiment, the epoxy may be cured by heating or other thermal process.

Referring again to FIG. 1, package 10 is encapsulated using a variety of well know encapsulating techniques including liquid encapsulating processes or transfer molding, such as molded array packaging (MAP) or cavity molding. The encapsulation step forms body 11 (illustrated by dashed lines) for package 10. Typically, the encapsulation is configured to expose the top surface of leadframe 21 in order to form a heatsink that improves the thermal characteristics of package 10. In other embodiments, the top surface of leadframe 21 may also be encapsulated. The lower or bottom surfaces of respective pads 50 and 51 are exposed outside of body 11 to form respective external terminals or leads 41 and 42 for the gate and source leads of package 10. Length 29 of supports 32 and 33 ensures that distal ends 43 and 44 of respective supports 32 and 33 of leadframe 21 form a drain lead of package 10.

After molding, package 10 normally is excised to remove tie bars 47 and 48 and any other portions of assembly 45.

In view of all of the above, it is evident that a novel device and method is disclosed. As can be seen, using multiple die attach areas allows leadframes 18-21 to accept several different die sizes while ensuring that each die size still provides proper electrode alignment with the contact pads of lower leadframe 49. Positioning the die attach areas on the drain side uses the largest contact surface of the semiconductor die which results in positively locating the die on the upper leadframe and in the resulting package. Using the lower surfaces of supports 32 and 33 to form leads of the package minimizes the number of elements and process steps required to form package 10 thereby lowering the costs. Using positioning element 53 and feature 54 assists in maintaining proper alignment between die 36 and lower leadframe 49.

While the subject matter of the invention is described with specific preferred embodiments, it is evident that many alternatives and variations will be apparent to those skilled in the semiconductor arts. For clarity of the explanation, the configuration of the preferred embodiment is explained, however, other embodiments should provide similar configurations. Although die 36 is explained as a vertical MOS transistor, other die may also be assembled within package 10. For example, the substrate of the die may not have an electrode of the die formed thereon. The die may have fewer or more source electrodes than die 36. The die may have more electrodes on the top surface than the two electrodes illustrated for die 36 and the die may be another type of semiconductor device instead of a vertical MOS transistor, such as a lateral transistor or an integrated circuit having more than three electrical terminals. The upper leadframe may have more or fewer die attach areas than the three areas described as long as one die attach area has a fixed position relative to the contact pads of the lower leadframe. Pads 51 may be formed in other configurations such as formed as one continuous piece instead of the two separate pieces illustrated in FIG. 2. Furthermore, pads 50 and 51 may be in the same plane as tie bars 47 because leadframe 21 together with elements 53 provide alignment for the semiconductor die. Also, the positioning element, such as element 53 and feature 54, may have different configurations as long as the positioning element/feature holds the upper leadframe in position relative to the contact pads (such as pads 50/51) of the lower leadframe and also positions the lower end of the upper leadframe to be exposed as an external terminal or lead of the semiconductor package.

The invention claimed is:

1. A method of forming a semiconductor package comprising:
    forming a first leadframe of the semiconductor package having a plurality of die attach areas on a first surface of the first leadframe wherein the plurality of die attach areas are separated from each other by a recess in the first surface including forming a support element of the first leadframe extending away from the first surface at a first angle;
    forming a second leadframe of the semiconductor package having a plurality of contact pads for electrically contacting electrodes of a semiconductor die wherein the electrodes are on a first surface of the semiconductor die including forming the second leadframe having a positioning element with a positioning feature that is formed to mate with the support element of the first leadframe;
    attaching the semiconductor die to a first die attach area of the plurality of die attach areas with a die attachment material;
    positioning the first leadframe over the second leadframe with the support element of the first leadframe mating with the positioning feature to position the electrodes of the semiconductor die to overlie at least a portion of the plurality of contact pads of the second leadframe;
    attaching the first and second contact pads of the second leadframe to the electrodes of the semiconductor die; and
    encapsulating the first and second leadframes with an encapsulating material wherein a portion of the plurality of contact pads are exposed to form first and second leads of the semiconductor package and wherein a distal end of the support element is exposed to form a third lead of the semiconductor package.

2. The method of claim 1 wherein attaching the semiconductor die to the first die attach area includes attaching the semiconductor die to more than one die attach area of the plurality of die attach areas.

3. The method of claim 1 wherein positioning the first leadframe includes placing an electrically conducting attachment material on the plurality of contact pads prior to the positioning step, and
    wherein attaching the plurality of contact pads includes curing the electrically conducting attachment material.

4. The method of claim 1 wherein no attachment material is used to attach the support element to the positioning element or to the positioning feature during the step of positioning the first leadframe over the second leadframe.

5. The method of claim 1 wherein forming the first leadframe includes forming the first leadframe with a plurality of support elements extending away from the first surface at an angle that is less than one hundred eighty degrees to the first surface.

6. A method of forming a semiconductor package comprising:
    forming a first leadframe of the semiconductor package having a plurality of die attach areas on a first surface of the first leadframe wherein the plurality of die attach areas are formed to be attached to a single semiconductor die and wherein the plurality of die attach areas are separated from each other and from the first surface by a recess to prevent die attachment material from bridging between the plurality of die attach areas including forming a support element of the first leadframe extending away from the first surface at a first angle; and
    forming a second leadframe of the semiconductor package having a plurality of contact pads for electrically contacting electrodes of the single semiconductor die wherein the second leadframe is configured to underlie the first leadframe including forming the second leadframe having a positioning element with a positioning feature that is formed to mate with the support element of the first leadframe.

7. The method of claim 6 further including encapsulating the first and second leadframes with an encapsulating material wherein a portion of a first and second contact pads of the plurality of contact pads are exposed to form first and second leads of the semiconductor package and wherein a distal end of the support element is exposed to form a third lead of the semiconductor package.

8. The method of claim 6 wherein forming the second leadframe having the positioning element with the positioning feature that is formed to mate with the support element of the first leadframe includes forming the positioning feature to surround three sides of the support element and expose a distal end of the support element.

9. The method of claim 8 further including encapsulating the first and second leadframes wherein the positioning feature is not attached to the support element with an attachment material prior to the encapsulating step.

10. The method of claim 6 further including encapsulating the first and second leadframes wherein at least a portion of the second surface of the first leadframe is exposed after the encapsulating is complete.

* * * * *